(12) United States Patent
Keith

(10) Patent No.: US 7,236,010 B1
(45) Date of Patent: Jun. 26, 2007

(54) REDUCED AREA FREEZE LOGIC FOR PROGRAMMABLE LOGIC BLOCKS

(75) Inventor: Duwel Keith, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 123 days.

(21) Appl. No.: 11/215,597

(22) Filed: Aug. 30, 2005

(51) Int. Cl.
*H03K 19/177* (2006.01)
(52) U.S. Cl. .......................... 326/41; 326/47
(58) Field of Classification Search ............ 326/37–39, 326/41, 47
See application file for complete search history.

(56) References Cited

U.S. PATENT DOCUMENTS

| 5,243,233 | A |   | 9/1993  | Cliff |
|-----------|---|---|---------|-------|
| 5,612,642 | A |   | 3/1997  | McClintock |
| 5,821,787 | A |   | 10/1998 | McClintock et al. |
| 6,020,760 | A | * | 2/2000  | Sample et al. ................. 326/41 |
| 6,157,210 | A |   | 12/2000 | Zaveri et al. |
| 6,452,423 | B1 | * | 9/2002 | Das et al. .................... 326/113 |
| 6,897,678 | B2 | * | 5/2005 | Zaveri et al. ................. 326/39 |
| 7,000,161 | B1 |   | 2/2006 | Allen et al. |
| 2006/0038585 | A1 |   | 2/2006 | Krishnappa et al. |
| 2006/0038586 | A1 |   | 2/2006 | Xia et al. |

\* cited by examiner

*Primary Examiner*—James H. Cho
(74) *Attorney, Agent, or Firm*—Steven J. Cahill

(57) ABSTRACT

Techniques are provided for implementing freeze logic on programmable logic blocks. The output signal of a register in each programmable logic block is driven to a predefined state in response to a freeze signal. The freeze signal also causes a multiplexer in each programmable logic block to select the output signal of the register. The multiplexer drives an output signal of the programmable logic block to a predefined state to eliminate contention between circuit elements. The freeze logic requires a small amount of area in each programmable logic block.

20 Claims, 2 Drawing Sheets

REDUCED AREA FREEZE LOGIC FOR PROGRAMMABLE LOGIC BLOCKS

BACKGROUND OF THE INVENTION

1. Field of the Invention

The present invention relates to programmable logic blocks, and more particularly to techniques for providing freeze logic for programmable logic blocks.

2. Description of Related Art

Programmable logic integrated circuits (ICs) include devices such as field programmable gate arrays (FPGAs), programmable logic devices (PLDs), and programmable logic arrays (PLAs). When a programmable logic IC is configured, nodes in the IC can enter undefined states, causing unwanted power consumption, contention between circuit elements, and possibly circuit failure.

Many FPGAs use a freeze methodology to prevent circuit contention during configuration mode. According to the freeze methodology, pre-defined voltage values are driven to interconnect lines in the IC and/or logic in the IC is disabled using freeze logic and other freeze signals during the configuration mode. The freeze logic implements the freeze methodology on all logic block outputs.

For example, on programmable logic array blocks in FPGAs made by Altera Corporation of San Jose, Calif., freeze logic is incorporated into the output logic of the logic elements (LEs) to properly disable the LE outputs, while the IC is frozen using a freeze logic signal. The freeze logic signal effectively disables the output multiplexers and forces the output driver to a high state, in accordance with the freeze methodology.

In the freeze methodology, each output multiplexer in each logic element requires its own control logic to disable the output of the multiplexer and to enable a weak pull down driver. The control logic in each multiplexer requires 3 inverters and 2 NAND gates, and a weak pull down to drive the output driver. Each logic element has 3 output multiplexers and 3 outputs. The freeze methodology is implemented on all LE outputs. Thus, the freeze methodology is expensive in terms of silicon real estate, because there are multiple outputs per LE, and the control logic is replicated for each output.

It would therefore be desirable to provide techniques for freezing a programmable logic IC during configuration mode that require less silicon area.

BRIEF SUMMARY OF THE INVENTION

The present invention provides techniques for implementing freeze logic on programmable logic blocks. The output signal of a register in each programmable logic block is driven to a predefined state in response to a freeze signal. The freeze signal also causes a multiplexer in each programmable logic block to select the output signal of the register. The multiplexer drives an output signal of the programmable logic block to a predefined state to eliminate contention between circuit elements. Freeze logic of the present invention requires a very small amount of area in each programmable logic block.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
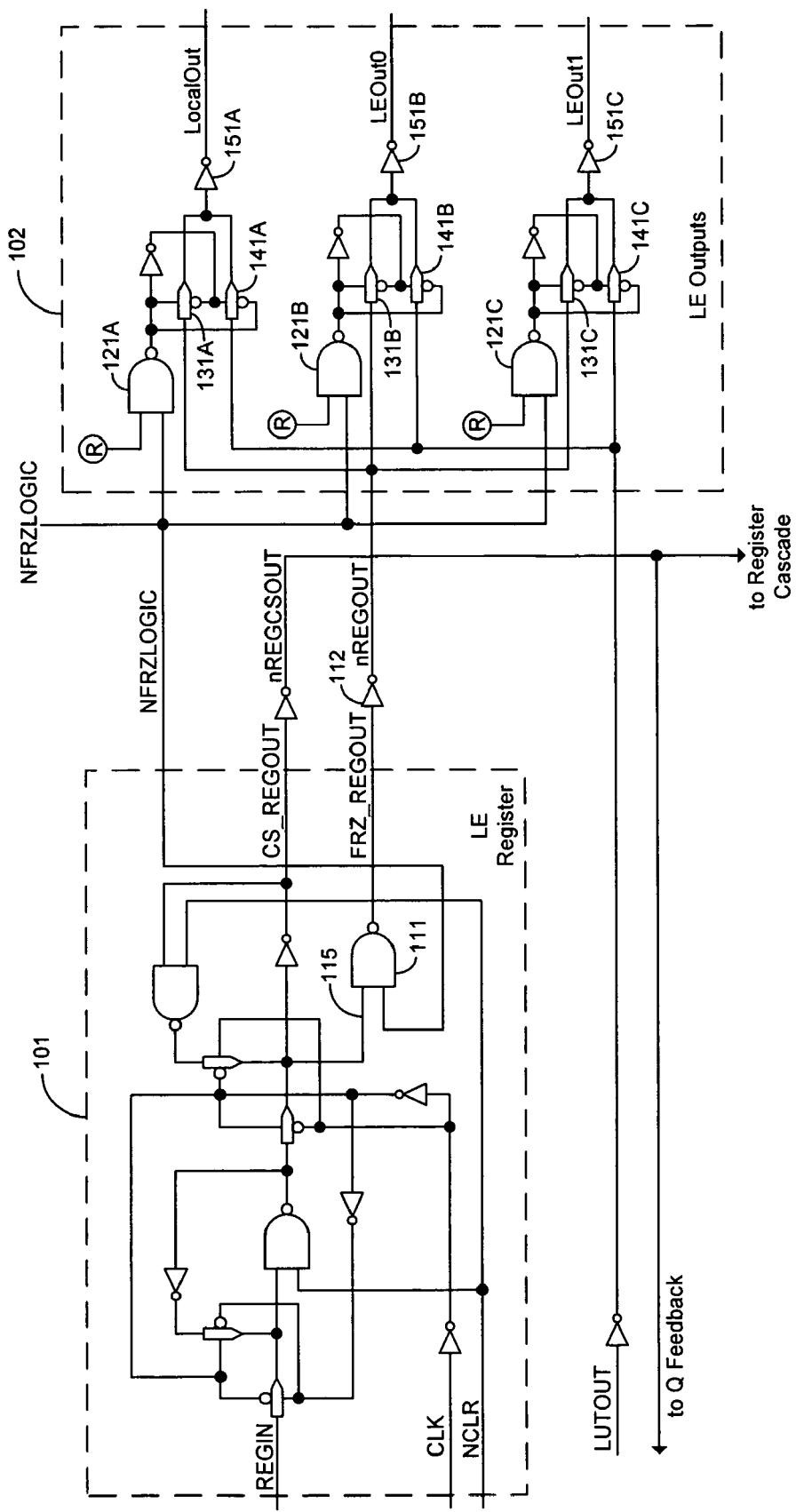
FIG. 1 is a block diagram of a portion of a programmable logic block that contains freeze logic according to an embodiment of the present invention.

FIG. 1 is a block diagram illustrating a portion of a programmable logic block that includes freeze logic for freezing the outputs of the programmable logic block during configuration mode according to an embodiment of the present invention. FIG. 1 illustrates a programmable logic block referred to as a logic element (LE). A logic element is one type of programmable logic block that can be used with the techniques of the present invention. It should be understood that the present invention can be applied to numerous types of programmable logic blocks.

The logic element (LE) of FIG. 1 includes a register 101, an output block 102, and a lookup table or LUT (not shown). Register 101 receives input signal REGIN, clock signal CLK, and clear signal NCLR. Register 101 generates two output signals nREGCSOUT and nREGOUT. The first register output signal nREGOUT is transmitted to output block 102. The second register output signal nREGCSOUT is transmitted to a register cascade and a Q feedback input (not shown).

Output block 102 includes three multiplexers and three drivers. The first multiplexer includes NAND gate 121A, transmission gates 131A and 141A, and inverting driver 151A. The second multiplexer includes NAND gate 121B, transmission gates 131B and 141B, and inverting driver 151B. The third multiplexer includes NAND gate 121C, transmission gates 131C and 141C, and inverting driver 151C. Inverting drivers 151A–151C are typically large inverters that drive long lines.

Output block 102 has three outputs that generate three output signals LocalOut, LEOut0, and LEOut1. The LocalOut, LEOut0, and LEOut1 output signals are the output signals of the logic element.

One input of each of the NAND gates 121A–121C is coupled to receive a CRAM bit (labeled R in FIG. 1). The CRAM bits are configuration data that is loaded during the configuration mode. The configuration data programs the functionality of the FPGA during the user mode.

The second input of each NAND gate 121A–121C is coupled to receive a freeze logic signal NFRZLOGIC. The inputs of the transmission gates 131A–131C are coupled to receive the LE register output signal nREGOUT. The inputs of transmission gates 141A–141C are coupled to receive the output LUTOUT of the lookup table.

The freeze logic in the embodiment of FIG. 1 includes NAND gate 111 and inverter 112. These two logic gates are the only freeze logic circuits added to the logic element to freeze the logic element outputs during configuration mode in the example of FIG. 1. The present invention provides a reduction in die area (about 3%) relative to the previous freeze methodology described in the Background of the Invention section.

By reducing the silicon die area using the freeze logic of the present invention, the cost of a programmable logic IC can be reduced without incurring additional constraints. The freeze methodology is a non-speed critical feature. Therefore, timing constraints do not provide significant limitations on how the freeze logic can be implemented.

Details of how the freeze methodology of FIG. 1 functions will now be described. The freeze mode is initiated by the freeze logic signal NFRZLOGIC. The freeze logic signal NFRZLOGIC can be generated by configured logic (not shown) during the configuration mode. In one example embodiment, the freeze logic signal is generated from a central point on a programmable logic IC and transmitted to each logic element.

During the configuration mode, the freeze logic signal NFRZLOGIC is driven to a logic low, causing NAND gate 111 to pull its output signal FRZ_REGOUT high, regardless of the logic state of input 115. The freeze logic signal disables the normal output signal path of register 101 through NAND gate 111. When the FRZ_REGOUT signal is high, inverter 112 drives the register output signal nREGOUT low. The nREGOUT output signal remains low during the configuration mode as long as NFRZLOGIC is low. The freeze logic signal does not effect the nREGCSOUT output signal.

The freeze logic signal NFRZLOGIC also causes NAND gates 121A–121C to pull their output signals high, regardless of the state of the CRAM bits coupled to the second inputs of NAND gates 121A–121C. When the output signals of NAND gates 121A–121C are high, transmission gates 131A–131C are forced to couple register output signal nREGOUT to drivers 151A–151C, and transmission gates 141A–141C are forced to decouple LUTOUT from drivers 151A–151C. Thus, the LUT output LUTOUT cannot be coupled to the logic element outputs as long as NFRZLOGIC is low.

Because nREGOUT is forced to remain low by NFRZLOGIC, inverting drivers 151A–151C drive the three logic element output signals LocalOut, LEOut0, and LEOut1 high. The output signals LocalOut, LEOut0, and LEOut1 of the logic element remain high during the configuration mode as long as the freeze logic signal NFRZLOGIC is low.

Thus, the freeze logic signal prevents the configuration data (i.e., the CRAM bits) from effecting the output signals of the logic element during the configuration mode (which is when the CRAM is being configured). By preventing the CRAM bits from effecting the LE output signals, contention between circuit elements is eliminated during the configuration mode.

The freeze logic circuitry 111 and 112 of the present invention can be replicated in other logic elements on a programmable logic IC. The freeze logic and the freeze signal can keep the logic element output signals high during configuration mode. Alternatively, the freeze logic and the freeze logic signal can drive the logic element output signals low during configuration mode.

Maintaining the logic element output signals in defined states during configuration mode eliminates contention between circuit elements. After all of the configuration data has been loaded, and the IC is ready to function in user mode, the freeze logic signal is de-asserted.

After the configuration mode has ended, the freeze signal NFRZLOGIC in FIG. 1 is driven high. When the freeze signal NFRZLOGIC is high, input 115 controls the output voltage FRZ_REGOUT of NAND gate 111 and the output voltage nREGOUT of inverter 112. Thus, input signals REGIN, CLK, and CLR can control the register output signal nREGOUT during user mode. Also, the CRAM bits control the output signals of NAND gates 121A–121C during user mode when freeze signal NFRZLOGIC is high. During user mode, the CRAM bits control whether the multiplexers in block 102 select the register output signal nREGOUT or the LUT output signal LUTOUT.

Figure 2:
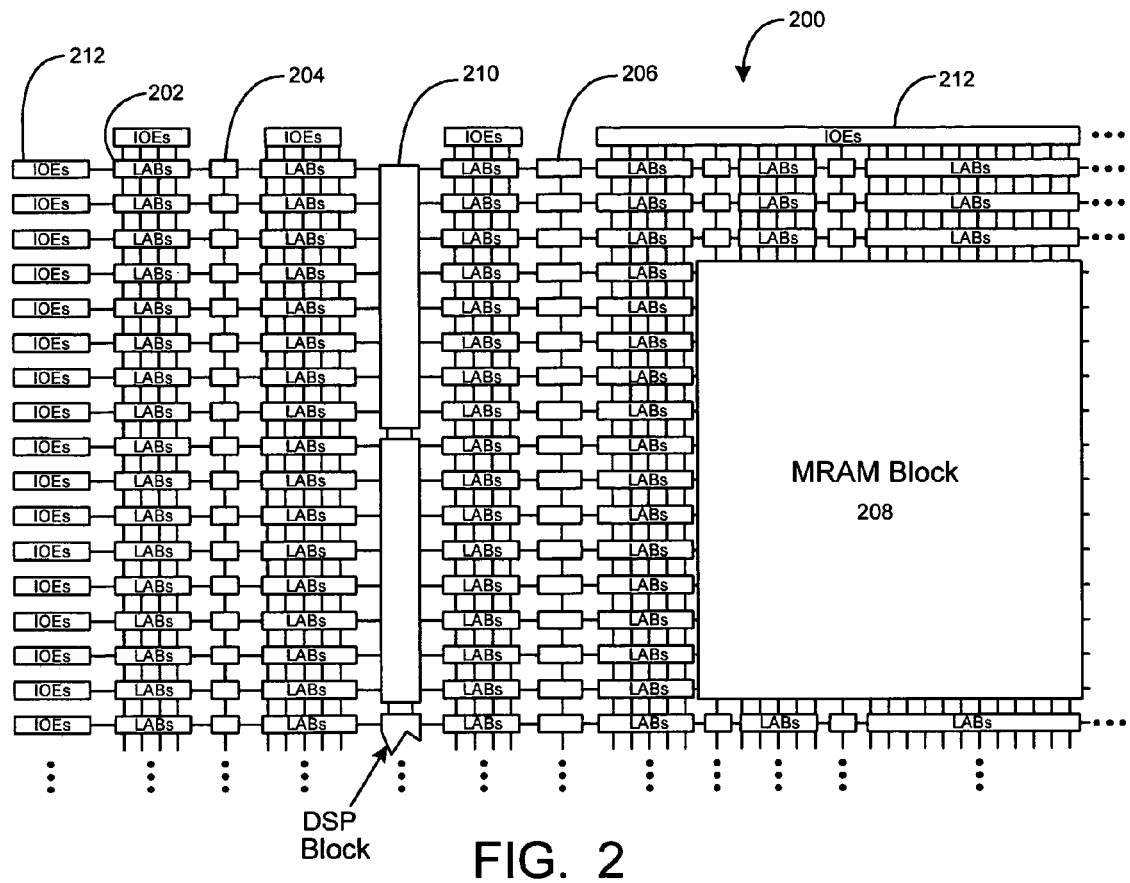
FIG. 2 is a simplified block diagram of a field programmable gate array that can be used with the techniques of the present invention.

FIG. 2 is a simplified partial block diagram of one example of FPGA 200 that can include aspects of the present invention. It should be understood that the present invention can be applied to numerous types of integrated circuits such as field programmable gate arrays (FPGAs), programmable logic devices (PLDs), complex programmable logic devices (CPLDs), programmable logic arrays (PLAs), and application specific integrated circuits (ASICs) that have at least one programmable logic block.

FPGA 200 is an example of a programmable logic integrated circuit in which techniques of the present invention can be implemented. FPGA 200 includes a two-dimensional array of programmable logic array blocks (or LABs) 202 that are interconnected by a network of column and row interconnects of varying length and speed. LABs 202 include multiple (e.g., 10) logic elements (or LEs).

An LE is a programmable logic block that provides for efficient implementation of user defined logic functions. A FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 200 also includes a distributed memory structure including RAM blocks of varying sizes provided throughout the array. The RAM blocks include, for example, 512 bit blocks 204, 4K blocks 206, and a block 208 providing 512K bits of RAM. These memory blocks can also include shift registers and FIFO buffers.

FPGA 200 further includes digital signal processing (DSP) blocks 210 that can implement, for example, multipliers with add or subtract features. I/O elements (IOEs) 212 located, in this example, around the periphery of the device support numerous single-ended and differential I/O standards. It is to be understood that FPGA 200 is described herein for illustrative purposes only and that the present invention can be implemented in many different types of PLDs, FPGAs, and the like.

Figure 3:
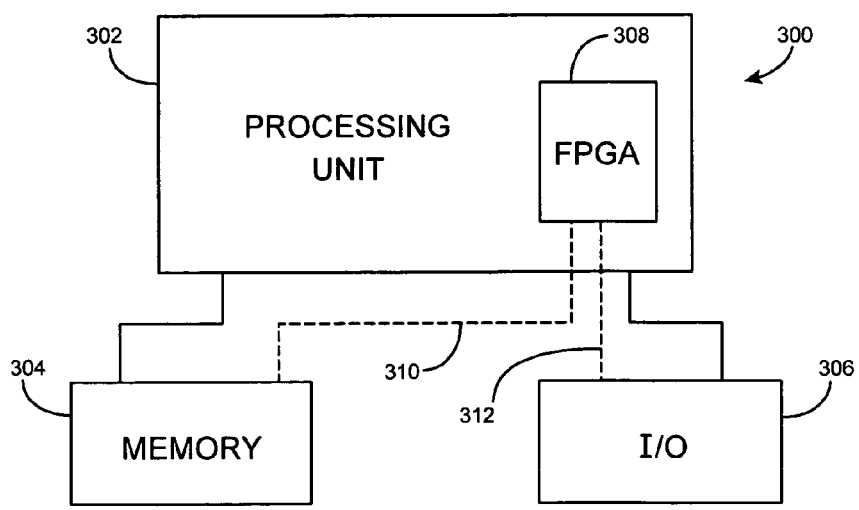
FIG. 3 is a block diagram of an electronic system that can implement embodiments of the present invention.

While FPGAs of the type shown in FIG. 2 provide many of the resources required to implement system level solutions, the present invention can also benefit systems wherein a FPGA is one of several components. FIG. 3 shows a block diagram of an exemplary digital system 300, within which the present invention can be embodied. System 300 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 300 can be provided on a single board, on multiple boards, or within multiple enclosures.

System 300 includes a processing unit 302, a memory unit 304 and an I/O unit 306 interconnected together by one or more buses. According to this exemplary embodiment, an FPGA 308 is embedded in processing unit 302. FPGA 308 can serve many different purposes within the system in FIG. 3. FPGA 308 can, for example, be a logical building block of processing unit 302, supporting its internal and external operations. FPGA 308 is programmed to implement the logical functions necessary to carry on its particular role in system operation. FPGA 308 can be specially coupled to memory 304 through connection 310 and to I/O unit 306 through connection 312.

Processing unit 302 can direct data to an appropriate system component for processing or storage, execute a program stored in memory 304 or receive and transmit data via I/O unit 306, or other similar function. Processing unit 302 can be a central processing unit (CPU), microprocessor, floating point coprocessor, graphics coprocessor, hardware controller, microcontroller, field programmable gate array programmed for use as a controller, network controller, and the like. Furthermore, in many embodiments, there is often no need for a CPU.

For example, instead of a CPU, one or more FPGAs 308 can control the logical operations of the system. In an embodiment, FPGA 308 acts as a reconfigurable processor, which can be reprogrammed as needed to handle a particular computing task. Alternately, FPGA 308 can itself include an embedded microprocessor. Memory unit 304 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. An integrated circuit comprising:
   programmable logic blocks each having at least one register and at least one multiplexer, wherein an input of the multiplexer is coupled to receive an output signal of the register; and
   freeze logic circuitry coupled to the register in each of the programmable logic blocks that drives the output signal of the register in response to a freeze signal during a configuration mode,
   wherein the multiplexer selects the output signal of the register in response to the freeze signal and drives an output signal of the programmable logic block.

2. The integrated circuit defined in claim 1 wherein each of the programmable logic blocks has at least two multiplexers that each have an input coupled to receive the output signal of the register, and each of the two multiplexers selects the output signal of the register in response to the freeze signal and drives an output signal of the programmable logic block.

3. The integrated circuit defined in claim 2 wherein each of the programmable logic blocks has at least three multiplexers that each have an input coupled to receive the output signal of the register, and each of the three multiplexers selects the output signal of the register in response to the freeze signal and drives an output signal of the programmable logic block.

4. The integrated circuit defined in claim 1 wherein the multiplexer includes a logic gate that is coupled to receive a CRAM bit and the freeze signal, and the logic gate prevents the CRAM bit from controlling the multiplexer in response to the freeze signal.

5. The integrated circuit defined in claim 3 wherein the three multiplexers each have a logic gate that is coupled to receive a CRAM bit and the freeze signal, and the logic gate in each of the three multiplexers prevents the CRAM bit from controlling the multiplexer in response to the freeze signal.

6. The integrated circuit defined in claim 1 wherein the freeze logic circuitry comprises a NAND gate coupled to receive the freeze signal.

7. The integrated circuit defined in claim 6 wherein the freeze logic circuitry further comprises an inverter coupled to an output of the NAND gate.

8. The integrated circuit defined in claim 1 wherein the register in each of the programmable logic blocks includes a second output signal that is not responsive to the freeze signal.

9. The integrated circuit defined in claim 1 wherein the freeze logic circuitry allows the register to drive the register output signal during a user mode when the freeze signal is not asserted.

10. The integrated circuit defined in claim 1 wherein the integrated circuit is a field programmable gate array that is part of a digital system comprising a processor, a memory coupled to the processor, and an I/O unit coupled to the processor.

11. A method for freezing output signals of programmable logic blocks on an integrated circuit during a configuration mode, the method comprising:
    driving an output signal of a register in each programmable logic block in response to a freeze signal using freeze logic circuitry;
    selecting the register output signal in response to the freeze signal using a multiplexer in each programmable logic block; and
    driving an output signal of each programmable logic block in response to an output signal of the multiplexer.

12. The method defined in claim 11 wherein selecting the register output signal further comprises selecting the register output signal in response to the freeze signal using two multiplexers in each programmable logic block, and wherein driving the output signal of each programmable logic block further comprises driving two output signals of each programmable logic block in response to the two multiplexers.

13. The method defined in claim 12 wherein selecting the register output signal further comprises selecting the register output signal in response to the freeze signal using three multiplexers in each programmable logic block, and wherein driving the output signal of each programmable logic block further comprises driving three output signals of each programmable logic block in response to the three multiplexers.

14. The method defined in claim 11 further comprising:
    preventing CRAM bits from controlling the three multiplexers in response to the freeze signal using logic gates.

15. The method defined in claim 11 wherein the register in each of the programmable logic blocks includes a second output signal that is not responsive to the freeze signal.

16. The method defined in claim 11 further comprising:
    allowing the register to drive the register output signal using the freeze logic circuitry during a user mode when the freeze signal is not asserted.

17. A programmable logic integrated circuit comprising:
    programmable logic blocks each having at least one register and at least one multiplexer, wherein an input of the multiplexer is coupled to receive an output signal of the register;

freeze logic circuitry coupled to the register in each programmable logic block that disables the output signal of the register when a freeze signal is asserted during a configuration mode, wherein the multiplexer in each programmable logic block selects the output signal of the register when the freeze signal is asserted; and a driver coupled to receive the output of the multiplexer in each programmable logic block that drives an output of the programmable logic block.

18. The programmable logic integrated circuit defined in claim 17 wherein each of the programmable logic blocks has at least two multiplexers that each have an input coupled to receive the output signal of the register, and each of the two multiplexers selects the output signal of the register in response to the freeze signal.

19. The programmable logic integrated circuit defined in claim 17 wherein the freeze logic circuitry comprises an NAND gate.

20. The programmable logic integrated circuit defined in claim 17 wherein each of the programmable logic blocks further comprises logic gates coupled to receive CRAM bits and the freeze signal, the logic gates preventing the CRAM bits from controlling the multiplexers when the freeze signal is asserted.

* * * * *

UNITED STATES PATENT AND TRADEMARK OFFICE
CERTIFICATE OF CORRECTION

| | | |
|---|---|---|
| PATENT NO. | : 7,236,010 B1 | Page 1 of 1 |
| APPLICATION NO. | : 11/215597 | |
| DATED | : June 26, 2007 | |
| INVENTOR(S) | : Keith Duwel | |

It is certified that error appears in the above-identified patent and that said Letters Patent is hereby corrected as shown below:

On the title page of the patent, section (12), the inventor's last name "Keith" should be changed to --Duwel--.

On the title page of the patent, section (75), the inventor's name "Duwel Keith" should be changed to --Keith Duwel--.

Signed and Sealed this

Seventh Day of August, 2007

JON W. DUDAS
*Director of the United States Patent and Trademark Office*